(12) United States Patent
Keil et al.

(10) Patent No.: US 6,540,885 B1
(45) Date of Patent: Apr. 1, 2003

(54) PROFILE CONTROL OF OXIDE TRENCH FEATURES FOR DUAL DAMASCENE APPLICATIONS

(75) Inventors: Douglas Keil, Fremont, CA (US); Eric Wagganer, Milpitas, CA (US); Bryan A. Helmer, Fremont, CA (US)

(73) Assignee: Lam Research Corp., Fremont, CA (US)

( * ) Notice: Subject to any disclaimer, the term of this patent is extended or adjusted under 35 U.S.C. 154(b) by 106 days.

(21) Appl. No.: 09/821,427

(22) Filed: Mar. 28, 2001

Related U.S. Application Data

(60) Provisional application No. 60/265,267, filed on Jan. 30, 2001.

(51) Int. Cl.[7] .......................... C23C 14/00; B44C 1/22; B23P 15/00; G01L 21/30
(52) U.S. Cl. .......................... 204/192.33; 204/192.35; 216/38; 216/39; 216/59; 216/67
(58) Field of Search ........................ 204/192.32, 192.33, 204/192.35; 216/38, 39, 59, 67

(56) References Cited

U.S. PATENT DOCUMENTS 5,994,206 A * 11/1999 Gupta et al. ................ 438/476
2002/0028552 A1 * 3/2002 Lee et al. .................... 438/243
2002/0106838 A1 * 8/2002 Cleeves et al. .............. 438/131

OTHER PUBLICATIONS

English abstract of JP 4–330767.*

English abstract of JP 64–66940.*

* cited by examiner

*Primary Examiner*—Steven H. VerSteeg
(74) *Attorney, Agent, or Firm*—Martine & Penilla, LLP

(57) ABSTRACT

Methods for etching a trench into a dielectric layer are provided. One exemplary method controls an ion-to-neutral flux ratio during etching so as to achieve a neutral limited regime in an ion assisted etch mechanism where the neutral limited regime causes bottom rounding. The method includes modulating physical sputtering causing microtrenching to offset the bottom rounding so as to produce a substantially flat bottom trench profile. Some notable advantages of the discussed methods of etching a trench into a dielectric layer includes the ability to eliminate the intermediate etch stop layer. Elimination of the etch stop layer will decrease fabrication cost and process time. Additionally, the elimination of the intermediate stop layer will improve device performance.

21 Claims, 5 Drawing Sheets

PROFILE CONTROL OF OXIDE TRENCH FEATURES FOR DUAL DAMASCENE APPLICATIONS

CROSS REFERENCE TO RELATED APPLICATIONS

This application claims priority from U.S. Provisional Patent Application No. 60/265,267 filed Jan. 30, 2001 and entitled "Profile Control of Oxide Trench Features for Dual Damascene Applications." This provisional application is herein incorporated by reference.

BACKGROUND OF THE INVENTION

1. Field of the Invention

This invention relates generally to methods and structures for improving the fabrication of multilevel interconnects in integrated circuits and more particularly to a system and method for optimizing a trench etch for a damascene application without an intermediate etch stop layer.

2. Description of the Related Art

As microprocessor speeds push toward 1 GHz and eventually beyond, radical changes in fabrication technology will be needed. Among these is the adoption of copper as an interconnect material. However, copper interconnect fabrication presents formidable challenges, as it is difficult to etch copper. Because of the increased use of Cu as an interconnect conductor and its challenges with the current fabrication methods, a contemporaneous interest in damascene fabrication methods has been pursued since damascene methods have shown the greatest promise for production worthy copper interconnect fabrication.

Damascene processes typically include, a trench or canal cut into the dielectric, the trench or canal then being filled with metal. In dual damascene processing, a second hole or via is formed within the trench. Implementation of the damascene methods proceeds by either the self-aligned dual damascene (SADD), trench first or via first approach. Of these three approaches, the SADD method is most difficult to control because of challenging lithography alignment requirements. Both trench first and via first have much greater and nearly equal tolerance for lithographic alignment error.

These damascene approaches may be implemented with an intermediate etch stop layer. The material commonly used for intermediate etch stop layers (e.g., silicon nitride) has a relatively high dielectric constant and can increase the capacitance of the dielectric stack. For example, an 800 Å silicon nitride stop layer can increase layer to layer interconnect coupling capacitance by about as much as 7% to 10%. As such, the use of intermediate etch stop layers increases fabrication cost and time because processes to apply and then remove the intermediate etch stop layer must be performed. Therefore, the removal of the intermediate etch stop layer is advantageous for device performance and cost. However, without the intermediate etch stop layers, stringent trench etch requirements for etch uniformity must be imposed on the damascene approaches.

The final trench profile of the damascene approaches described above is expected to have a rectangular cross section, which must be uniform across the wafer. One of the functions of the intermediate etch stop layer is to create a flat and uniform trench bottom profile. Departures from this standard profile make it difficult to control line resistance and to estimate trench critical dimension (CD) from line resistance data. Furthermore, device simulation codes typically assume rectangular cross sections to reduce computation time and cost. When the actual profiles depart this shape, comparison with simulated results becomes very difficult or even impossible.

In the absence of a stop layer, obtained trench bottom profiles are either microtrenched ("W" shaped) or bottom rounded ("U" shaped) profiles. It is inherently more difficult to get good seed layer coverage on microtrenched profiles. The very high curvature at the microtrench bottoms also results in high electric fields at these high curvature points and invites reduction of the dielectric breakdown voltage threshold. Solely trying to modulate the microtrenching in order to achieve a flat trench bottom profile without consideration of the ion and neutral limited regimes has not been successful. Vyvoda et al. discuss this approach in a paper entitled "Effects of plasma conditions on the shapes of features etched in $Cl_2$ and HBr plasmas. I. Bulk crystalline silicon etching", dated November/December 1998,which is herein incorporated by reference. Alternatively, bottom rounding is typically aspect ratio dependent which may lead to a loss of line resistance control.

As a result, there is a need to solve the problems of the prior art to provide a substantially flat and uniform trench profile across the wafer in the absence of an intermediate etch stop layer.

SUMMARY OF THE INVENTION

Broadly speaking, the present invention fills these needs by providing a method for etching substantially flat and uniform trench profile across a wafer in the absence of an intermediate etch stop layer. It should be appreciated that the present invention can be implemented in numerous ways, including as a process, an apparatus, a system, or a device. Several inventive embodiments of the present invention are described below.

In one embodiment, a method for etching a trench profile into a dielectric layer is provided. In this embodiment, an ion-to-neutral flux ratio is controlled during etching so as to achieve a neutral limited regime in an ion assisted etch mechanism, thereby causing bottom rounding. Additionally, physical sputtering is modulated so as to cause microtrenching to offset the bottom rounding so as to produce a substantially flat bottom trench profile.

In another embodiment, a method for etching trenches in a dielectric layer of a wafer in an etch chamber is provided. The etch chamber includes a top and bottom electrode, a chuck for holding the wafer and process gas inlets. The method for etching trenches in the dielectric layer includes applying process gases into the chamber and applying radio frequency (RF) power to the top and bottom electrodes. The method for etching further includes controlling an ion to neutral flux ratio so as to achieve a neutral limited regime in an ion assisted etch mechanism where the neutral regime causes bottom rounding and modulating physical sputtering, which causes microtrenching to offset the bottom rounding so as to produce a substantially flat trench bottom profile.

The advantages of the present invention are numerous. Most notably, the elimination of the intermediate stop layer will decrease fabrication cost and process time. Additionally, the elimination of the intermediate stop layer in dual damascene processes will improve device performance since a typical silicon nitride stop layer can increase layer to layer interconnect coupling capacitance by about as much as 7% to 10%.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a system and method for optimizing a trench etch for a damascene application without an intermediate etch stop layer. It will be obvious, however, to one skilled in the art, that the present invention may be practiced without some or all of these specific details. In other instances, well known process operations have not been described in detail in order not to unnecessarily obscure the present invention.

In order to solve the problems of the prior art, the embodiments of the present invention provide a system and method for controlling the parameters influencing the trench bottom profile, which in turn gives considerable control over the final etched profile in the absence of a stop layer.

Figure 1:
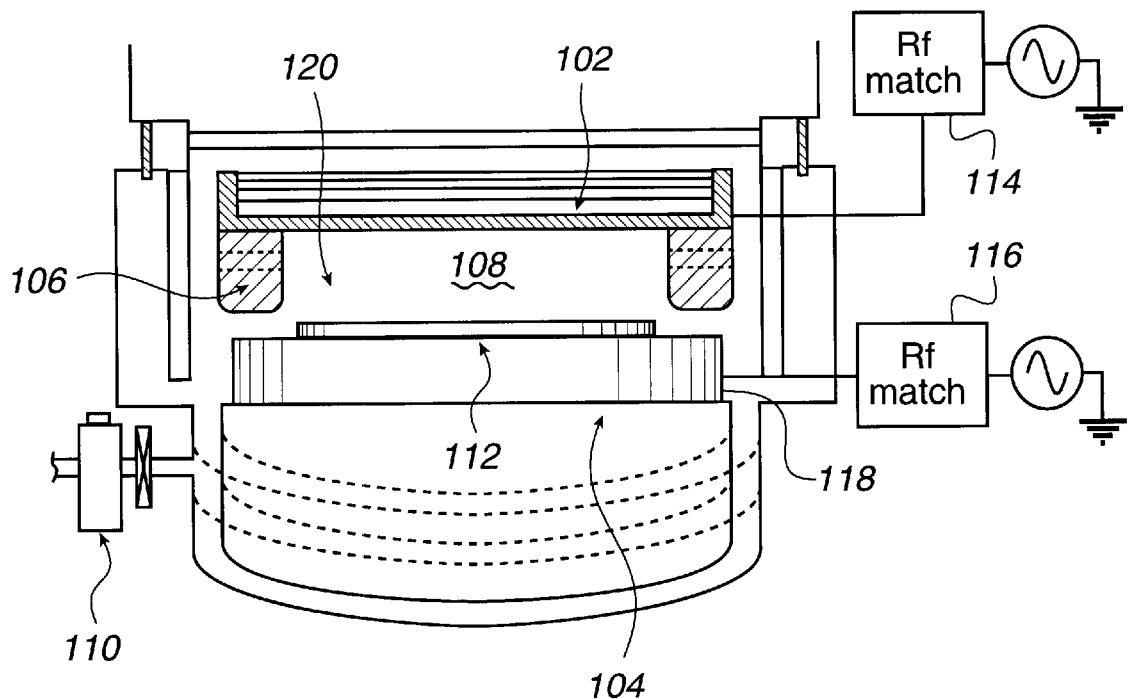
FIG. 1 illustrates a diagram displaying a dielectric etch system.

FIG. 1 illustrates diagram 100 displaying a dielectric etch system. In diagram 100, radio frequency (RF) power 114 is applied to a top electrode 102 at frequency of about 27 MHz to generate a medium density plasma. RF power 116 is applied to the bottom electrode 104 at a frequency of about 2 MHz primarily with the intent to control the relative ion energy. Confinement rings 106 at the perimeter of the process area maintain the plasma 108 to a region between the top electrode 102 and bottom electrode 104. Vacuum is maintained by a 400 l/sec helical groove pump 110. A 200 mm wafer 112 rests on a chuck 118. Wafers with various oxide types and thicknesses were used for these studies. The process gases 120 available included $CHF_3$, $CF_4$, Ar, $O_2$, etc. Total gas flows varied from about 150 to 950 standard cubic centimeters per second (sccm). Process chamber pressure varied between about 30 mT and 105 mT. Scanning electron microscope (SEM) analysis was performed using a Hitachi 4100 SEM calibrated using National Institute of Standards and Technology (NIST) standard RM 8090. In an effort to understand the parameters that influence the trench bottom profile, example trench etch studies were performed on a Lam Research dual frequency 4520XLE dielectric etch system. It should be understood that the ranges described above, e.g., power and pressure ranges, are specific to the 4520XLE dielectric etch system and not meant to be limiting to all etch systems. Accordingly, the parameters may vary as discussed in the ranges provided below in order to optimize the trench bottom profile for various etch systems.

The current understanding of mechanisms governing trench etch result are derived from site-balance relationships determined by Langmuir adsorption kinetics which have been extensively used to successfully model a variety of etch systems. A similar approach can be followed to develop a simple site-balance model for ion-assisted etching of oxide, assuming a process regime without significant deposition of fluorocarbon films (i.e. not near etch stop).

The approach assumes an etched surface covered with up to one monolayer of reactant supplied by an incident neutral flux $J_n$ (species/$cm^2$ sec). The reactant surface coverage (species/$cm^2$) corresponding to one monolayer is denoted by $n_o$. $\theta_n$ (unitless) represents the fraction of surface sites occupied by the reactant species. In this model, two etch mechanisms are assumed: an ion-assisted chemical etch mechanism and a physical sputtering mechanism. In the ion-assisted chemical etch mechanism, the adsorbed reactant etches the $SiO_2$ when sufficient energy is supplied by ion bombardment. In the case of physical sputtering, the ion bombardment physically removes or sputters the $SiO_2$ without the aid of the reactant. The etch rate R ($SiO_2$ removed/$cm^2$ sec) is given by the following expression:

$$R = Y_{ia}\theta_n J_i + Y_{ps}(1-\theta_n)J_i \qquad \text{Eq. 1a}$$

where the first term on the right-hand-side is the ion-assisted chemical etch rate, and the second term is the physical sputtering rate. Both rates are proportional to the ion flux $J_i$ (ions/$cm^2$ sec) and an etch yield, $Y_{ia}$ or $Y_{ps}$ ($SiO_2$ removed/ion). Both the ion-assisted chemical etch yield $Y_{ia}$ and the physical sputtering yield $Y_{ps}$ are functions of the ions' incident energies and angles. The ion-assisted chemical etch rate is proportional to $\theta_n$ (the fraction of the surface covered by reactant), whereas the physical sputtering rate is proportional to $(1-\theta_n)$ (the fraction of the oxide surface that is bare). The following site-balance equation is used to solve for $\theta_n$:

$$n_o \frac{d\theta_n}{dt} = S_o(1-\theta_n)J_n - a_{ia}Y_{ia}\theta_n J_i \qquad \text{Eq. 1b}$$

where the first term on the right-hand-side gives the rate of Langmuir adsorption, and the second term is the reactant removal rate due to the ion-assisted chemical etch mechanism. The reactant sticking coefficient is $S_o$, and $a_{ia}$ is a stoichiometric coefficient that represents the average number of reactant species that combine with $SiO_2$ to form the product species. After solving Eq. 1b for the steady-state ($d\theta_n/dt=0$) surface coverage $\theta_{n,ss}$, and substituting it in Eq. 1a, the following expression for the steady-state etch rate is obtained:

$$R_{ss} = \frac{(Y_{ia} - Y_{ps})J_i}{1 + \frac{a_{ia}Y_{ia}J_i}{S_o J_n}} + Y_{ps}J_i \qquad \text{Eq. 1c}$$

The two limiting cases for Eq. 1c, the "ion limited" regime and the "neutral limited" regime are next reviewed in further detail. The "ion-limited" regime occurs when $S_o J_n \gg a_{in} Y_{ia} J_i$. In this regime, the surface is well populated with adsorbed neutral reactant species (i.e., $\theta_{n,ss} \approx 1$); the ion-assisted chemical etch mechanism is dominant; and the etch rate is controlled by the rate at which the ions provide energy to the surface. In this limit, the above rate equation simplifies to:

$$R_{ss,ion-limited} = Y_{ia} J_i \qquad \text{Eq. 1d}$$

In the ion-limited regime, Eq. 1d shows that the local etch rate and the profile evolution are determined primarily by the local values of the ion flux and yield (which is a function of the ions' energies and angles) at each point on the surface.

The other "neutral-limited" regime occurs when $S_o J_n \ll a_{ia} Y_{ia} J_i$. In this regime, there are few adsorbed reactants (i.e., $\theta_{n,ss} \ll 1$), and Eq. 1c simplifies to:

$$R_{ss,neutral-limited} = \frac{(Y_{ia} - Y_{ps})S_o J_n}{a_{ia} Y_{ia}} + Y_{ps} J_i \qquad \text{Eq. 1e}$$

It is understood that the etch rate in the neutral-limited regime is a function of both the reactant and ion fluxes. This functional dependence results from the inclusion of the physical sputtering mechanism in the model. If the physical sputtering mechanism is neglected ($Y_{ps}=0$), then the neutral-limited etch rate is a function of the neutral flux only. However, if both terms on the right-hand-side of Eq. 1e have similar magnitudes, then the local etch rate and profile evolution in the neutral-limited regime will be determined by the transport of both the ions and the neutral reactants. For the typical conditions in most fluorocarbon etch processes, it is reasonable to assume that the contribution of the physical sputtering mechanism is much smaller than that of the ion-assisted chemical etch mechanism. However, the sputtering mechanism is important for controlling the trench bottom profile by offsetting the bottom rounding occurring in a neutral limited regime, as discussed below.

Process reactors which have well isolated "source" RF power and "bias" RF power show no increase in plasma density as the "bias" RF is increased. In this event, entry into an ion-limited regime is often signaled by an etch rate dependent on RF bias power. Since the source RF power creates both ions and neutral reactant via electron collisions with the feed stock gas, an etch rate dependence on source power (or the lack thereof) is difficult to interpret. However, capacitively-coupled reactors typically do not have well isolated source RF and bias RF power. Frequently, RF power applied to the wafer chuck produces significant plasma density increases over what is generated from the source power alone. For this reason, etch rate dependence on power is a misleading indicator of the etch regime in a capacitively-coupled reactor. An alternative etch regime "signature" is etch rate dependence on the etchant feed stock gas flow rate. Strong etch rate dependence on etchant feedstock gas signals entry into a neutral-limited etch regime.

Consider first a neutral-limited trench etch in the absence of physical sputtering. Since neutrals are not accelerated by the plasma sheath, they arrive at the etched surface with nearly isotropic angular distribution determined solely by geometric considerations. To simplify, a unity sticking coefficient will be assumed ($S_o \approx 1$). Previous fluorocarbon ia etch simulations performed at Lam Research required fitted sticking coefficients of about 0.5 to obtain good agreement with observed profile evolution. Others have reported values of about 0.3. Thus, assuming $S_o \approx 1$ may not yield correct quantitative results but it can be expected to give correct qualitative trends.

Figure 2:
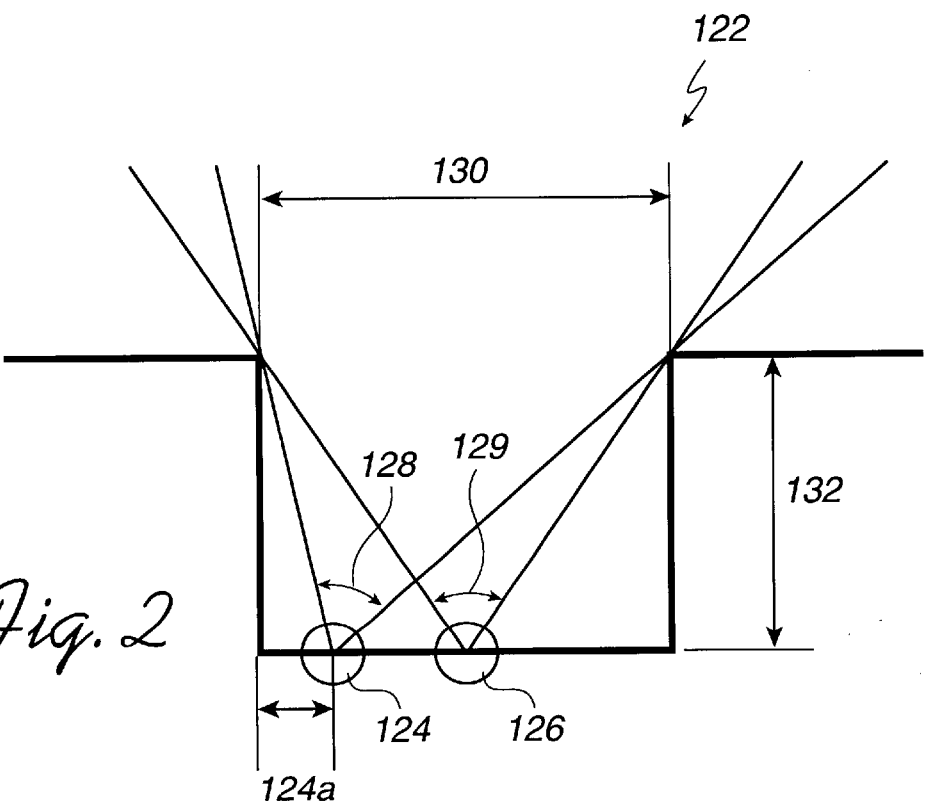
FIG. 2 illustrates a diagram displaying the relevant geometry of neutrals to the etched surface.

For $S_o \approx 1$, reflection or re-emission of neutrals from sidewalls can be ignored. Arrival of neutrals to the etched surface is then by line-of-sight transport from plasma to the etch site. FIG. 2 illustrates a diagram 122 displaying the relevant geometry assuming arrival of neutrals to the etched surface is by line-of-sight transport. The ratio of the instantaneous etch rate $R_x$ at site x 124 and rate $R_c$ at site c 126 (trench center) in FIG. 2 is then proportional to the ratio of neutral fluxes arriving at site x 124 and site c 126. The ratio of neutral fluxes is, in turn, equal to the ratio of angles subtended by the direct line-of-sight to the plasma from each site (angles $\theta_x$ 128 for site x and $\theta_c$ 129 for site c of FIG. 2 and of Eq. 2). The percent difference in etch rate, % D(w,d,x), between sites x and c is the given in Eq. 2.

$$\% \, D(d, w, x) = 100\left(1 - \frac{R_x}{R_c}\right) = 100\left(1 - \frac{\theta_x}{\theta_c}\right) \qquad \text{Eq. 2}$$

Where $\theta_x$ and $\theta_c$ are given (in radians) by Eq. 3 and Eq. 4 below.

$$\theta_x(d, w, x) = \pi - \tan^{-1}\left(\frac{d}{x}\right) - \tan^{-1}\left(\frac{d}{w-x}\right) \qquad \text{Eq. 3}$$

$$\theta_c(d, w) = 2\tan^{-1}\left(\frac{w}{2d}\right) \qquad \text{Eq. 4}$$

As $x_s$ 124a of FIG. 2 approaches 0, the % D(d,w,x) then gives the percent difference in instantaneous etch rate between the trench center and sidewall base. Furthermore, % D(d,w, $x_s \to 0$) reduces to a function of aspect ratio only. In FIG. 2, the aspect ratio (A) is equal to the trench depth, d 132, divided by the trench width, w 130.

Figure 3:
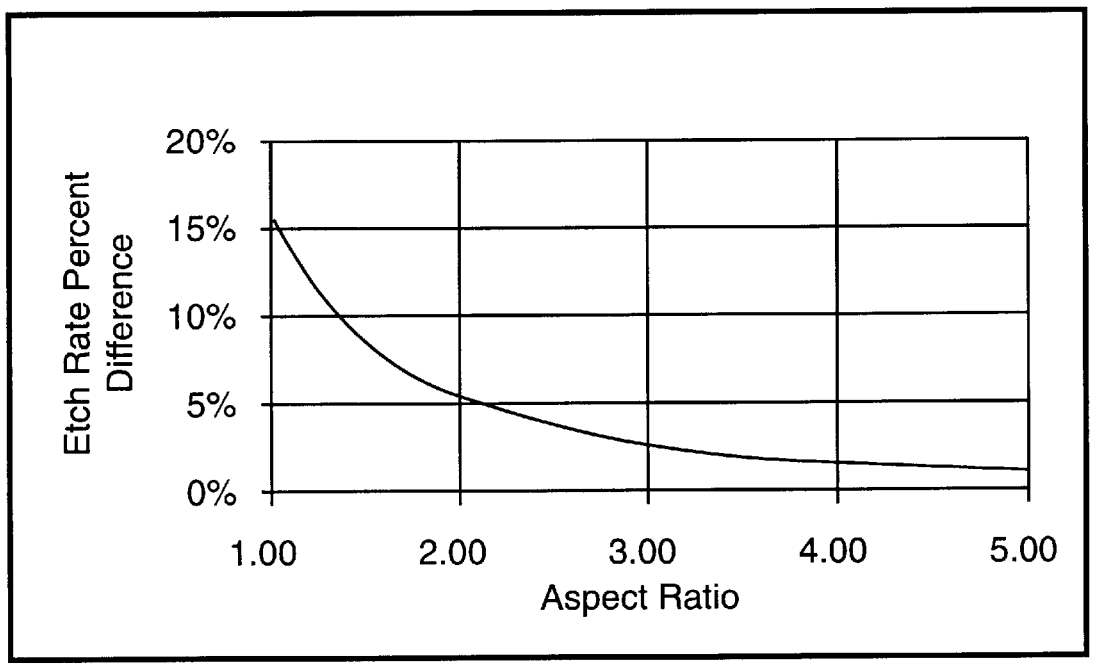
FIG. 3 illustrates a plot of percent difference between instantaneous etch rate at trench center and edge (base of sidewall) as a function of aspect ratio in a neutral limited regime in the absence of physical sputtering.

FIG. 3 illustrates a plot 134 of percent difference between instantaneous etch rate at trench center and edge (base of sidewall) as a function of aspect ratio in a neutral limited regime in the absence of physical sputtering. It should be noted that the thickness of the resist must be included in the aspect ratio calculation.

Inspection of FIG. 3 and of Eq. 2 to 4 reveals two important bottom rounding behavioral trends in this neutral limited regime. The first is that the factors promoting bottom rounding are most influential early in the etch when the aspect ratio is the smallest. As aspect ratio increases, there is a tendency for the etch rate to become more uniform over the trench bottom surface. This has the effect of preserving the rounding that was formed earlier in the etch. The second notable point is that as lithographic feature critical dimension (CD) shrinks, the aspect ratio seen at the beginning of the etch will increase. Thus, less propensity for bottom rounding is expected as trench CD shrinks.

It is believed that microtrenching is caused by ion reflection from feature sidewalls. Although most of this work was done for chlorine etching of Si, similar results are expected for fluorocarbon etching of $SiO_2$. Sidewall ion reflection causes a focusing of the ion flux at the base of the feature sidewalls. In an ion-limited regime this will enhance the etch rate near the sidewall base. In a neutral-limited regime, the etch rate near the sidewall base will only be enhanced for an ion energy and flux high enough to initiate physical sputtering. Thus an ion-limited regime leaves one open to microtrenching, but one can also have microtrenching in a neutral-limited regime if physical sputtering can prevail. This can occur for sufficiently high bias (bottom) power, although other process parameters may be important also. For example, the ion flux, as well as the distribution of ion bombardment energies and angles, will also depend upon parameters such as the source power from the top electrode and the gas pressure. It is understood that these studies have shown that the microtrenching depth is correlated with sidewall angle. As the sidewall becomes more vertical, i.e. approaching a 90° angle to the trench bottom, less microtrenching is expected.

In a capacitively coupled reactor, plasma density and ion flux are expected to rise as pressure increases. The average ion energy is expected to decrease with increasing pressure. Production of the reactant species by dissociation of either $CF_4$ and $CHF_3$ may also be a function of pressure. Thus one can only conclude that the ion-to-neutral flux ratio, $S_o J_n / a_{ia} Y_{ia} J_i$, which determines whether the etch regime is ion- or neutral-limited, and the maximum physical sputtering rate $Y_{ps} J_i$, which contributes to microtrenching, will both vary with pressure. It can further be appreciated that the ion-to-neutral flux ratio will reduce to a ratio of the respective fluxes, $J_n$ and $J_i$, within an etch system. The details of this variation must be determined by experiment.

In summary, it should be possible to tune process parameters such as pressure, power supply, gas flow, sidewall slope, wafer temperature, cooling regions on electrostatic chuck (ESC), etc., to affect the trench bottom profile and achieve the desired flat trench bottom. For example, in the neutral-limited etch regime, we expect a rounded trench bottom profile if the etch rate is a function of the neutral flux only. However, if the physical sputtering mechanism is small, but not negligible, and if the ions scatter from the sloped sidewalls, it may be possible to take advantage of the tendency to form microtrenches in order to "square out" the corners of the trench bottom and thus offset bottom rounding. In a preferred embodiment of the invention, the ion-to-neutral flux ratio is controlled by pressure.

It should be understood that the above description is distinct from the profile evolution that typically occurs at the onset of etch stop. While it is true that a transition from a "W" (microtrenched) to a "U" (bottom rounded) shape often signals onset of etch stop, this behavior typically occurs only at a threshold aspect ratio much higher than those encountered for trench etch. Furthermore, the etch mechanism responsible for this transition has been shown to be very different than those described above.

Trench etch studies were implemented with the intent to explore the relevance of the theoretical picture presented above. The studies used a $CF_4/CHF_3/O_2$ gas chemistry with Ar used as a carrier gas. It can be appreciated that other etchant gases such as $C_2F_6$, $C_4F_6$, $C_4F_8$, $SF_6$, $C_5F_8$, etc., can be used. A two factor full factorial design of experiment (DOE) was implemented with pressure between about 30 mT to 105 mT and $CF_4$ flow between about 30 sccm to 60 sccm as variables. These studies employed TEOS (tetraethylorthosilicate) oxide wafers with a trench test pattern. Additional wafers employing various trench test patterns were etched as was needed to better understand the trends observed. Etch times were chosen to achieve etched depths between about 3000 Å and 5000 Å as are commonly found in commercial applications. The trench CD sizes examined ranged from about 0.30 μm to 10 μm.

Figure 4:
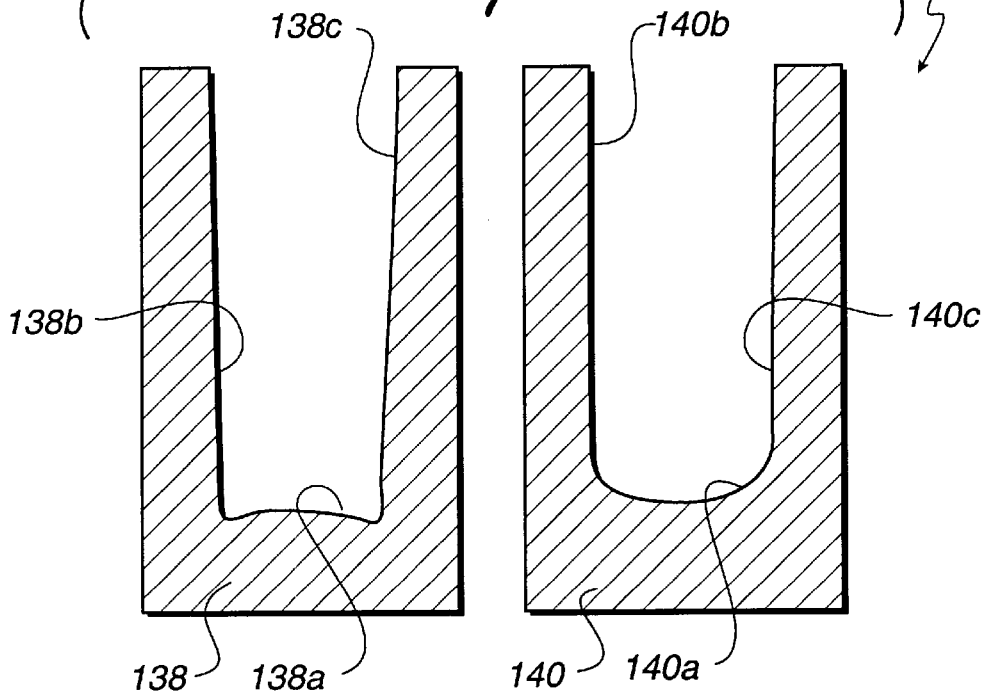
FIG. 4 displays a diagram illustrating the effect of chamber pressure on the shape of the trench bottom profile.

FIG. 4 displays diagram 136 illustrating the effect of chamber pressure on the shape of the trench bottom profile. Profile dependence on pressure is illustrated by comparing trench profile 138 to trench profile 140. Trench profile 138 including bottom 138a and sidewalls 138b and 138c is about a 0.33 μ trench etched at about 4000 Å with a microtrenched bottom trench profile 138a created using a pressure of about 30 mT. Trench profile 140 is about a 0.33 μ trench etched at about 4000 μ having sidewalls 140b and 140c with a rounded bottom trench profile 140a created using a pressure of about 105 mT. Comparison of the trench bottom profiles 138a and 140a shows a clear relationship between the pressure and resulting trench profile. Gas flow for the studies ranged from about 10 sccm for $O_2$ to about 30 to 60 sccm using $CF_4$. Similar results were obtained for the various gas flows used in the range of about 1 sccm to about 100 sccm. Argon was used as the carrier gas at a flow rate of about 100 sccm to about 1000 sccm. It can be appreciated that other etchant gases may be substituted for $CF_4$, such as any fluorine or chlorine based etchant gas. It can further be appreciated that other carrier gases may be substituted for Argon such as other inert gas. Additional wafers etched at other pressures further confirmed that the trench bottom profile does indeed move from a microtrenched to a rounded "U"-shaped profile as the chamber pressure is raised. It can be appreciated that the chamber pressure may range from about 10 mT to about 1000 mT to control the ion-to-neutral flux ratio in various etch chambers. After entry into a "U" shaped pressure regime it was found that the profile became progressively insensitive to further increases in pressure.

Figure 5:
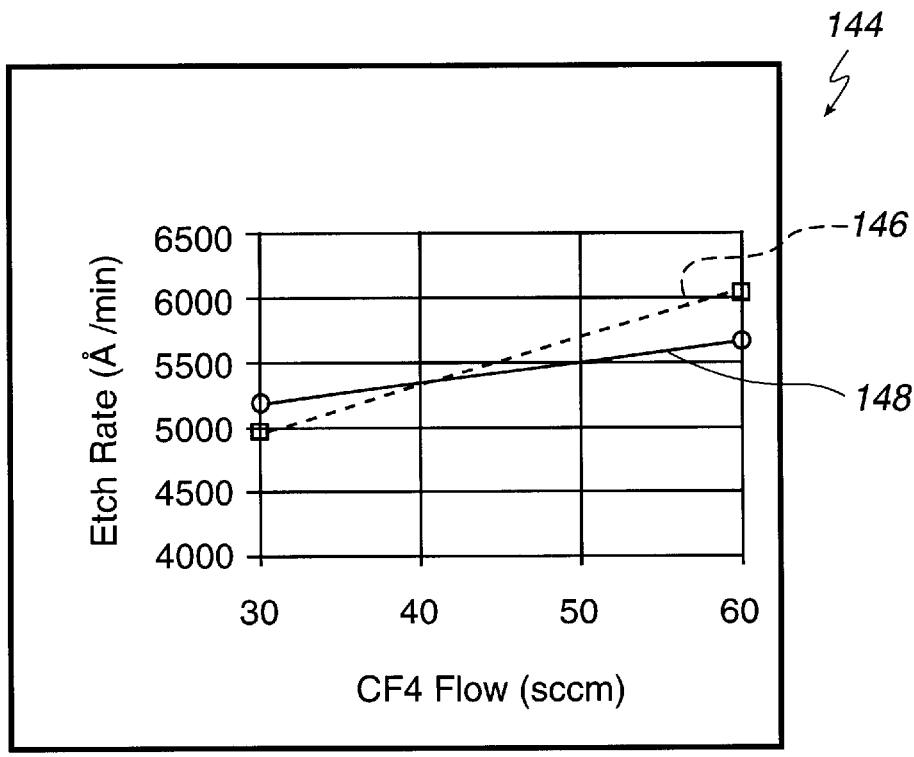
FIG. 5 displays a chart displaying observed etch rate dependence.

FIG. 5 displays a chart 144 displaying the observed etch rate dependence on $CF_4$ flow at both higher (105 mT) and lower (30 mT) chamber pressures. As can be seen from the chart the etch rate increases as $CF_4$ flow increases at both high chamber pressure (represented by the solid line 148) and low chamber pressure (represented by the dotted line 146). It can be appreciated that depending upon the dielectric tool being used and the type of dielectric material, the chamber pressure can range between about 10 mT to about 1000 mT, as mentioned previously. The data referred to in FIG. 5 was obtained using a recipe wherein the etchant gas, $CF_4$, flow was only a small fraction of the total gas flow. The ion flux was expected to be composed of mostly Ar ions, the carrier gas. It can be appreciated that other etchant and carrier gases may be used as described above. The result here indicates etching occurs in a neutral limited regime at both high and low pressure. Given this conclusion, one must also conclude that the microtrenching evident at low pressure in FIG. 4 occurs via sputtering.

Figure 6:
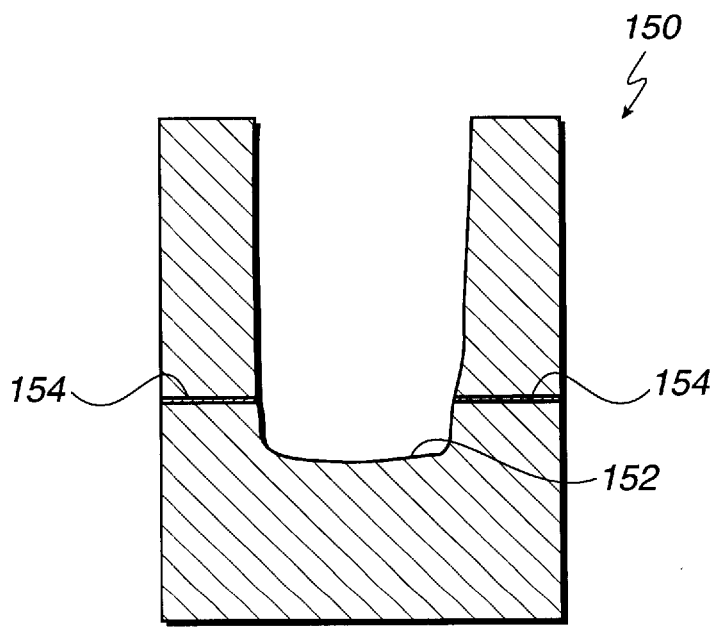
FIG. 6 displays a diagram representing a scanning electron microscope (SEM) cross section of a trench profile.

FIG. 6 displays a diagram 150 representing a SEM cross section of a trench profile. A brief 15 second partial etch was performed at a higher pressure (106 mT) using 60 sccm $CF_4$ and 10 sccm $O_2$ flow. The trench bottom 152 has a bottom rounded profile similar to that obtained using the full etch time (45 second) indicating that the bottom rounding formed early in the etch, in agreement with expected behavior as detailed above. Line 154 represents the resist/oxide interface.

Figure 7:
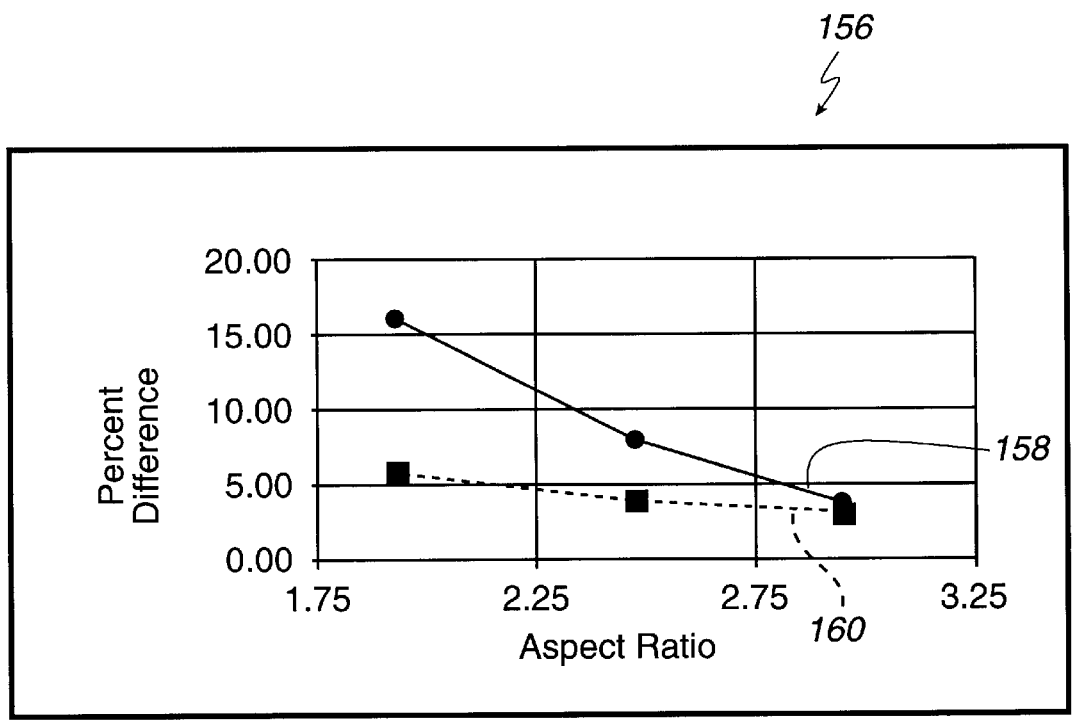
FIG. 7 displays a chart plotting the percent difference in etch rate between center and sidewall base.

FIG. 7 displays a chart 156 plotting the percent difference in etch rate between center and sidewall base for a trench etched at 30 mT and 60 sccm $CF_4$ flow. The observed experimental values are displayed by line 158. The predicted values based on Equation 2 listed above are represented by line 160. At high aspect ratio there is reasonable agreement between the predicted and observed values. This agreement becomes worse as aspect ratio shrinks. More importantly, one can see in this plot that there is agreement between theory and experiment in scaling with aspect ratio. In general, agreement between predicted and observed values was worse at higher pressure and reduced CF$_4$ flow. From these trends, the importance of neutral reflection (i.e. S$_o$<1) as these parameters are varied is evident.

Figure 8:
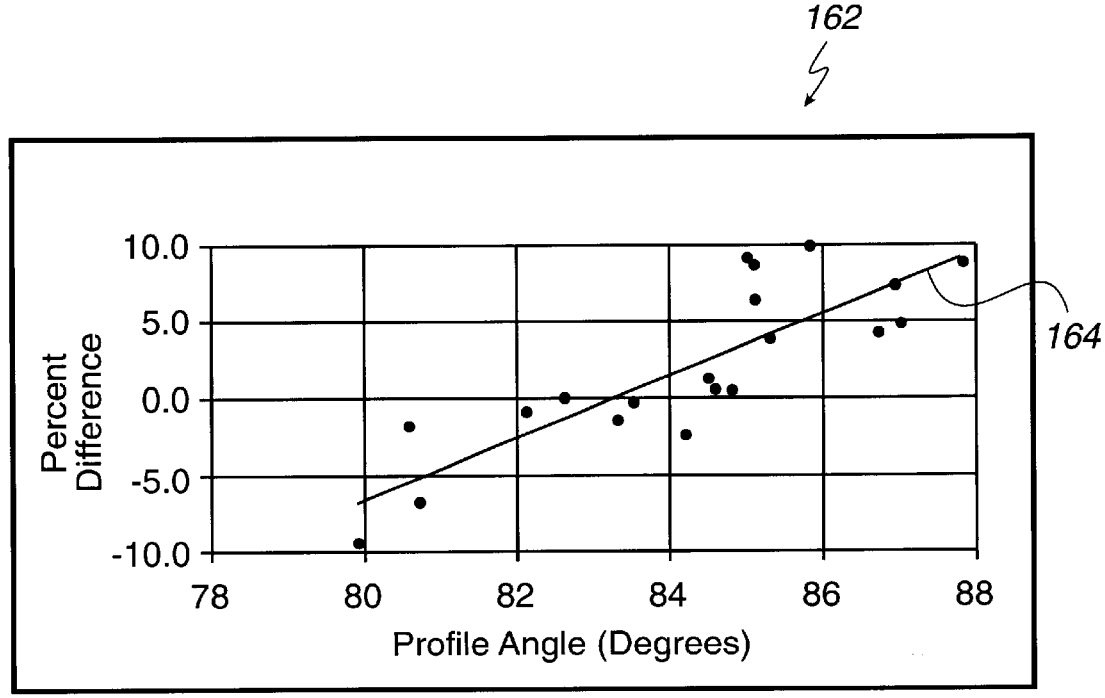
FIG. 8 displays diagram representing a plot of percent difference between center and sidewall base depth.

FIG. 8 displays diagram 162 representing a plot of percent difference between center and sidewall base depth. The data plotted represents results from various wafers etched at 30 to 105 mT with CF$_4$ varied from 30 to 60 sccm. Trench CD ranged from 0.35 μm to 10 μm. FIG. 8 shows that a roughly linear trend is followed through a linear regressive fit, line 164. Since profiles could not be measured with accuracy better than 0.3 degrees, some of the scatter can be attributed to measurement error. Despite this, a correlation between bottom rounding and profile angle is clearly shown. This correlation is consistent with known microtrenching behavior. FIG. 8 illustrates the importance of microtrenching control when attempting to achieve flat trench bottoms.

A variety of approaches are typically available to the process engineer for controlling sidewall angle. Common among these is the use of oxygen flow control. Changing oxygen flow from 0 to 20 sccm was found to alter the profile angle from about 80° to about 90°. It can be appreciated that adding a polymer precursor type gas such as CH$_3$, CH$_2$F, CH$_2$F$_2$, CH$_3$F, CHF$_3$, etc., will further alter the sidewall angle.

Figure 9:
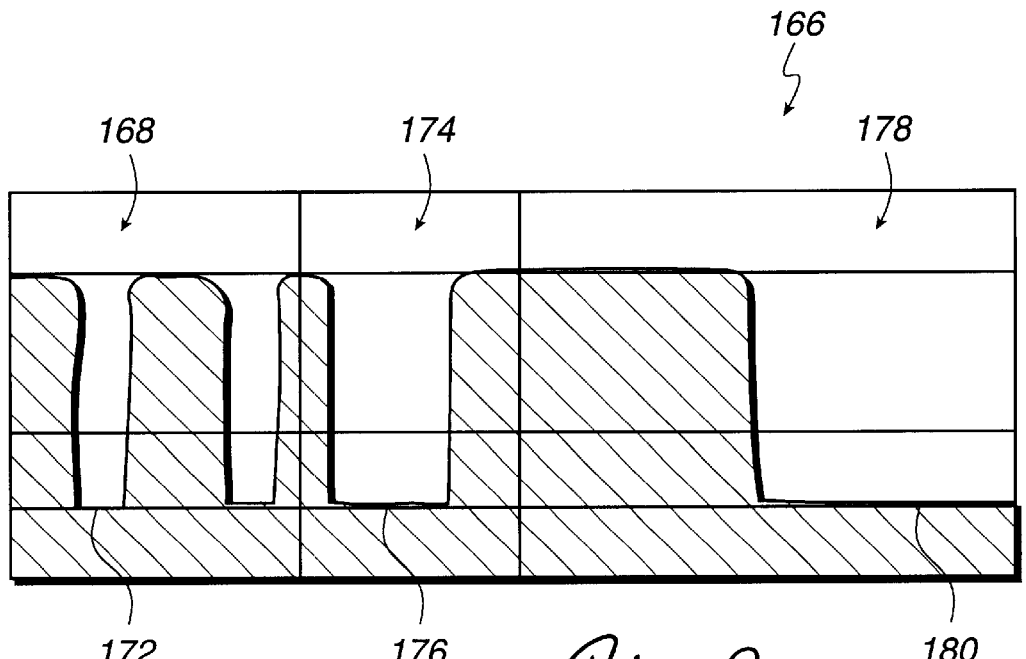
FIG. 9 displays diagram showing examples of optimized trench etches for a damascene application without a stop layer.

FIG. 9 displays diagram 166 showing examples of optimized trench etches for a damascene application without a stop layer. SEM cross section 168 shows a 0.35 micron trench with a flat bottom profile 172 after optimization. SEM cross section 174 shows a 0.70 micron trench with a flat bottom profile 176 after optimization. SEM cross section 178 shows an open area with a flat bottom profile 180 after optimization. RIE lags of less than 7% have been achieved with etch non-uniformity less than 3% over a wafer. These results demonstrate that fabrication using via first or trench first damascene can indeed be achieved without the use of a stop layer.

Figure 10:
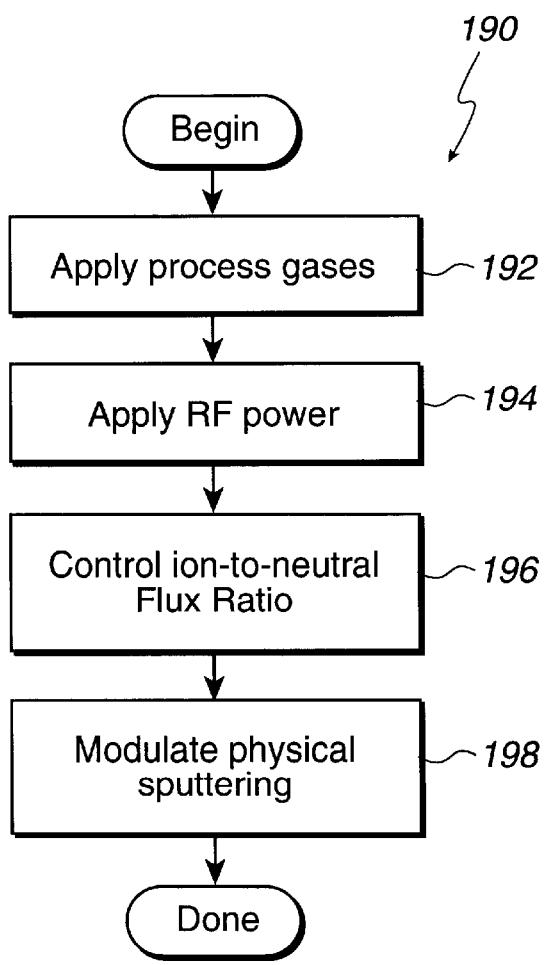
FIG. 10 illustrates a flowchart defining a method for etching a trench in a dielectric layer without a stop layer in accordance with one embodiment of the invention.

FIG. 10 illustrates a flowchart 190 defining a method for etching a trench in a dielectric layer without a stop layer in accordance with one embodiment of the invention. Flowchart 190 initiates with operation 192 where process gases are applied to an etch chamber. It can be appreciated that the process gases may include CHF$_3$, CF$_4$, Ar, N$_2$, O$_2$, etc. It can further be appreciated that other etchant gases may be used such as halogen based etchant gases (i.e., fluorine and chlorine etchant gases). The method then advances to operation 194 where RF power is applied to the top and bottom electrodes. In one embodiment of the invention the RF power to one electrode controls the creation of plasma and the RF power to the second electrode targets the control of ion energy.

Continuing with flowchart 190, the method advances to operation 196 where the ion-to-neutral flux ratio is controlled to enter the neutral limited regime in an ion assisted etch mechanism. Here the ion-to-neutral flux ratio, $S_o J_n / a_{ia} Y_{ia} J_i$ as described above, is controlled such that the ion flux exceeds the neutral flux and hence the neutral limited regime is entered. In other words, the neutral flux portion of the ratio, $S_o J_n$, is less than the ion flux portion of the ratio, $a_{ia} Y_{ia} J_i$. In one embodiment of the invention, the ion-to-neutral flux ratio is controlled through the chamber pressure. For example, as chamber pressure is increased more ions are present, and thus the ion flux portion of the ratio is greater than the neutral flux portion so that the neutral limited regime is entered. In another embodiment of the invention, varying the magnitude of the RF power controls the ion-to-neutral flux ratio. It can be appreciated that other control mechanisms exist whereby the neutral limited regime can be entered such as etch chamber design, electrode wafer area ratio, RF frequencies used, etc. It can be further appreciated that by varying the magnitude of the ratio the amount of bottom rounding will be determined. For example, as the ion flux portion of the ratio becomes greater than the neutral flux portion of the ratio, the bottom rounding becomes more pronounced.

Flowchart 190 then proceeds to operation 198, where the physical sputtering is modulated. Here, the modulation of the physical sputtering etch mechanism controls the degree of microtrenching occurring during the etching process. Accordingly, modulating the physical sputtering to control microtrenching and controlling the bottom rounding as described above, offset each other so that a trench profile with a flat bottom is generated without the use of a stop layer as depicted in FIG. 9. In one embodiment of the invention the physical sputtering is controlled by the angle of the sidewall to the trench bottom.

When considering the scaling trends, very good agreement between expected and observed behavior is seen. This work underscores the trench bottom profile dependence on both the ratio $S_o J_n / a_{ia} Y_{ia} J_i$, the maximum sputtering rate $Y_{ps} J_i$, the sidewall slope, and the resulting degree of ion scattering and microtrenching. Control of these behaviors in turn gives one considerable control over the final etched profile.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for etching a trench into a dielectric layer, comprising:

controlling an ion-to-neutral flux ratio during etching so as to achieve a neutral limited regime in an ion assisted etch mechanism, the neutral limited regime causing bottom rounding; and modulating physical sputtering, the physical sputtering causing microtrenching to offset the bottom rounding so as to produce a substantially flat trench bottom profile.

2. A method for etching a trench into a dielectric layer as recited in claim 1, wherein the modulating physical sputtering further comprises;

determining a sidewall angle for the trench to be etched into the dielectric layer; and setting an oxygen flow rate configured to achieve the sidewall angle.

3. A method for etching a trench into a dielectric layer as recited in claim 2, wherein the oxygen flow rate is between about 0 and about 20 standard cubic centimeters per minute.

4. A method for etching a trench into a dielectric layer as recited in claim 2, wherein the sidewall angle is between about 80° and about 90°.

5. A method for etching a trench into a dielectric layer as recited in claim 2, wherein the sidewall angle is between about 84° and about 89°.

6. A method for etching a trench into a dielectric layer as recited in claim 2, wherein the controlling an ion-to-neutral flux ratio during etching further comprises;

controlling chamber pressure to achieve a neutral limited regime.

7. A method for etching a trench into a dielectric layer as recited in claim 1, wherein the controlling an ion-to-neutral flux ratio during etching further comprises;

controlling chamber pressure to achieve a neutral limited regime.

8. A method for etching a trench into a dielectric layer as recited in claim 7, wherein the chamber pressure is between about 10 mT and about 1000 mT.

9. A method for etching a trench into a dielectric layer as recited in claim 1, wherein the controlling an ion-to-neutral flux ratio during etching further comprises;

controlling a radio frequency power to achieve a neutral limited regime.

10. A method for etching a trench into a dielectric layer as recited in claim 1, wherein the controlling an ion-to-neutral flux ratio during etching further comprises;

controlling a process gas flow rate to achieve a neutral limited regime.

11. In an etch chamber having a top and a bottom electrode, a chuck for holding a wafer that includes a dielectric layer to be etched, and process gas inlets, a method for etching trenches in the dielectric layer comprises:

applying process gases through the process gas inlets into the chamber;

applying radio frequency power to each of the top and bottom electrodes;

controlling an ion-to-neutral flux ratio during etching so as to achieve a neutral limited regime in an ion assisted etch mechanism, the neutral limited regime causing bottom rounding; and modulating physical sputtering, the physical sputtering causing microtrenching to offset the bottom rounding so as to produce a substantially flat trench bottom profile.

12. A method for etching a trench into a dielectric layer as recited in claim 11, wherein the modulating physical sputtering further comprises;

determining a sidewall angle for the trench to be etched into the dielectric layer; and setting an oxygen flow rate configured to achieve the sidewall angle.

13. A method for etching a trench into a dielectric layer as recited in claim 12, wherein the oxygen flow rate is between about 0 and about 20 standard cubic centimeters per minute.

14. A method for etching a trench into a dielectric layer as recited in claim 12, wherein the sidewall angle is between about 80° and about 90°.

15. A method for etching a trench into a dielectric layer as recited in claim 12, wherein the sidewall angle is between about 84° and about 89°.

16. A method for etching a trench into a dielectric layer as recited in claim 11, wherein the controlling an ion-to-neutral flux ratio during etching further comprises;

controlling chamber pressure to achieve a neutral limited regime.

17. A method for etching a trench into a dielectric layer as recited in claim 16, wherein the chamber pressure is between about 10 mT and about 1000 mT.

18. A method for etching a trench into a dielectric layer as recited in claim 11, wherein the applying the process gases into the chamber further comprises;

applying etchant gases to the chamber at a flow rate between about 1 and about 100 standard cubic centimeters per second.

19. A method for etching a trench into a dielectric layer as recited in claim 1, wherein the controlling an ion-to-neutral flux ratio during etching further comprises;

controlling radio frequency power to achieve a neutral limited regime.

20. A method for etching a trench into a dielectric layer as recited in claim 11, wherein the applying process gases into the chamber further comprises;

applying argon as a carrier gas.

21. A method for etching a trench into a dielectric layer as recited in claim 20, wherein the applying argon as a carrier gas further comprises;

setting a flow rate to achieve the neutral limited regime.

* * * * *